United States Patent [19]

Heinrich et al.

[11] Patent Number: 4,758,092
[45] Date of Patent: Jul. 19, 1988

[54] METHOD AND MEANS FOR OPTICAL DETECTION OF CHARGE DENSITY MODULATION IN A SEMICONDUCTOR

[75] Inventors: Harley K. Heinrich, Mulpitas; David M. Bloom, Menlo Park, both of Calif.

[73] Assignee: Stanford University, Stanford, Calif.

[21] Appl. No.: 836,020

[22] Filed: Mar. 4, 1986

[51] Int. Cl.⁴ .................. G01J 4/00; G01N 21/00; G01R 15/12
[52] U.S. Cl. ..................... 356/364; 356/365; 356/367; 356/433; 324/158 D; 324/158 R; 324/73 R
[58] Field of Search ............... 356/364, 351, 345, 350, 356/365, 367, 433; 324/158 R, 158 D, 73 R; 372/26, 49, 92

[56] References Cited

U.S. PATENT DOCUMENTS

| | | | |
|---|---|---|---|
| 4,144,503 | 3/1979 | Itoh et al. | 372/49 |
| 4,273,421 | 6/1981 | Gurtler | 356/433 |
| 4,480,916 | 11/1984 | Bareket et al. | 356/351 |
| 4,503,541 | 3/1985 | Weller et al. | 372/26 |
| 4,583,226 | 4/1986 | Liou | 372/92 |
| 4,661,770 | 4/1987 | von Roos | 324/158 D |

Primary Examiner—Eugene R. LaRoche
Assistant Examiner—Michael B. Shingleton
Attorney, Agent, or Firm—Flehr, Hohbach, Test, Albritton & Herbert

[57] ABSTRACT

Disclosed is a technique for probing dynamic sheet charge density variations in integrated semiconductor devices. Using a specially designed non-invasive Nomarski phase contrast interferometer a sheet charge density sensitivity of $2.6 \times 10^8$ e/cm²/$\sqrt{Hz}$ is extracted from experimental data for 1 mA of detected photocurrent. The charge density sensitivity makes possible $\mu V$ signal level detection in an active device, and with digital signals the corresponding signal/noise level is sufficiently high that multi-mega-baud data can be captured in real time.

7 Claims, 3 Drawing Sheets

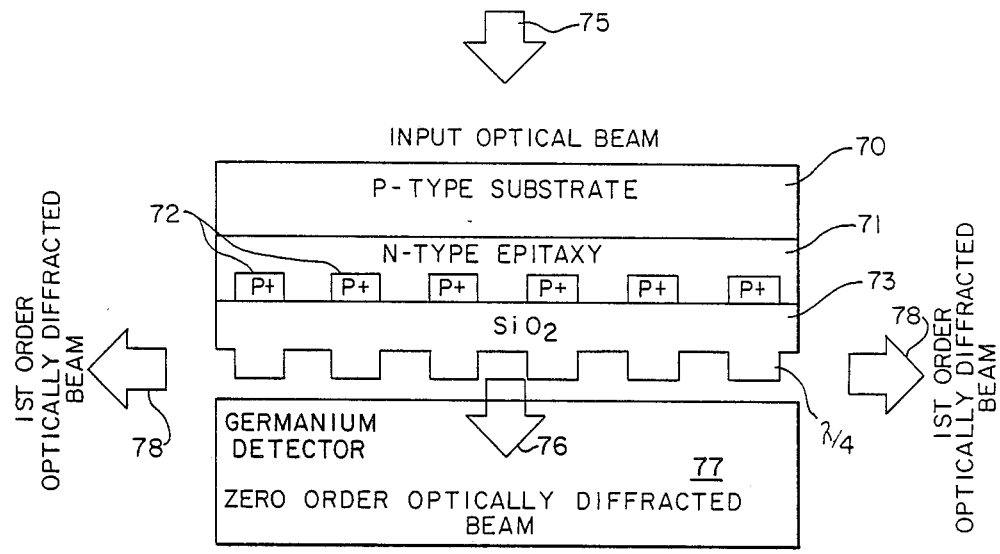
FIG.−6
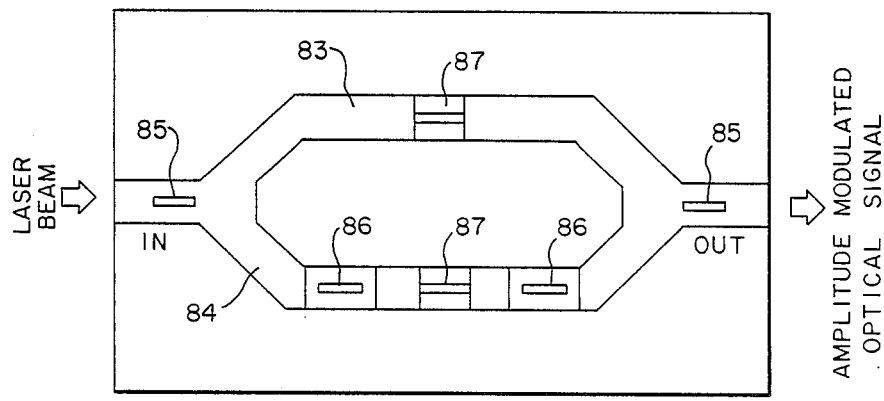
FIG.−7A
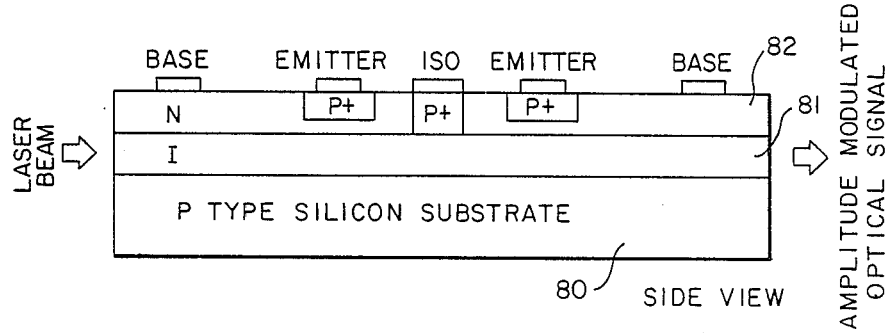
FIG.−7B

METHOD AND MEANS FOR OPTICAL DETECTION OF CHARGE DENSITY MODULATION IN A SEMICONDUCTOR

The U.S. Government has rights in the claimed invention pursuant to Department of Navy Contract No. N00014-84-K-0327.

This invention relates generally to the detection of charge density in a semiconductor, and more particularly the invention relates to optical detection techniques for detecting charge density.

Disclosed in co-pending application Ser. No. 06/648,456 filed Sept. 7, 1984 (Group 255) entitled "High Speed Testing of Electronic Circuits by Electro-Optic Sampling" is a technique for non-invasively measuring both analog and digital signals in gallium arsenide (GaAs) integrated circuits. These measurements have been shown to have a very high spatial resolution and a bandwidth which is limited only by the device under test. While this approach is adequate for measuring voltage waveforms it is limited to circuits fabricated on electro-optic substrates such as gallium arsenide. In addition, others have used an external electro-optic crystal to measure the signals in an integrated circuit. While these approaches are generally applicable to any type of integrated circuit, the techniques rely on either bonding the signal out to the electro-optic crystal or on bringing a piece of the crystal near the point to be measured. Hence these approaches introduce unwanted parasitics into the circuit.

Electro-optic detection in silicon is not possible since it is a symmetric crystal. However, free carriers in an active device perturb both the optical index of refraction and the absorption coefficient near the device. Modulators employing absorption by free carriers have been demonstrated. However, free carrier absorption is insignificant in the near infrared, where small optical spot sizes can be achieved and sensitive optical detectors are available. The phase shift produced by the index perturbation varies more slowly with wave lengths ($\phi \propto \lambda$) than the wave length ($\phi \sim \lambda^2$) dependence for the free carrier absorption. Thus significant phase modulation of the optical beam can be achieved in the near infrared even when no free carrier absorption can be detected.

The present invention is directed to the detection of charge density in a semiconductor. The invention can be employed to determine a modulation of the charge density or a measure of a static charge density. Among the applications of the invention is an integrated optical waveguide for use in an optical circuit interconnect.

Briefly, in accordance with one embodiment of the invention a polarized coherent light beam is passed onto an interferometer which establishes two polarized beams. The two polarized beams are focused on a silicon device under test with one beam focused on or near an active device and one beam providing a reference. After passing through the device under test the two beams are reflected off a metal layer and back through the device under test where they are recombined by the beam splitter. However, the charge carriers affect the index of refraction of silicon, and by modulating the charge in the active device a small modulation occurs in the index of refraction. The modulation affects the phase delay of the one beam near the active device in relation to the reference beam, and hence when the beams are recombined at the beam splitter they interfere and convert the relative phase modulation into an amplitude modulation which can be detected with a photodiode.

In another embodiment, the position of an optical beam is spatially modulated over a silicon wafer surface to detect stationary charge densities.

In yet another embodiment of the invention a silicon device is placed in a cavity between two Fabry-Perot etalons. The etalons are spaced at a distance equal to a multiple of one-half the laser beam wavelength (l(n$\lambda$)/2). Modulation of the charge density in an active region of the silicon device modulates the impinging beam which effectively varies the spacing of the two etalons. The signal passing from the cavity can be detected by a photodiode to determine signal modulation.

In still another embodiment of the invention a silicon body is provided with a silicon oxide layer on a major surface. The oxide layer has a step in thickness over an active device region of the body with the step being one-quarter of the wavelength of a laser beam. The oxide functions as a phase shifter to the beam passing through the device. The phase shifted beam is then passed through a single mode fiber to a photodiode. Phase modulation of the beam resulting from charge density modulation in the active device region is then converted to amplitude modulation by the single mode fiber and detected by the photodiode.

In accordance with a feature of the invention, a single mode integrated optical waveguide and a photodiode can be integrated in the body of a silicon wafer along with an active device region. Modulated charge density modulates the phase of a laser beam passing through the device region, and the modulated beam is transmitted by the single mode optical waveguide to the photodiode for detection.

The invention and objects and features thereof will be more readily apparent from the following detailed description and appended claims when taken with the drawing.

FIG. 3 is a detector output voltage in response to a device under test signal in the apparatus of FIG. 1.

FIG. 6 is a sectional view of a silicon charge density modulated grating coupled optical interconnect in accordance with an embodiment of the invention.

FIGS. 7A and 7B are a top view and a section view of an electro-optic modulator in accordance with an embodiment of the invention.

In accordance with one embodiment of the invention, shot noise limited interferometric detection of refractive index variations from free carrier modulation in silicon devices is achieved and has potential use in measuring internal device characteristics and $\mu$V signals non-invasively in an integrated circuit. Since electrons and holes in a semiconductor behave as a free carrier plasma with effective masses $m_e^*$ and $m_h^*$ respectively, simple electromagnetic theory predicts that these charges will perturb the index of refraction according to the relationship $$n = n_o\sqrt{1 - w_p^2/\omega^2}$$

where $w_p$ is the plasma resonant frequency given by $$w_p^2 = \frac{q^2 N}{\epsilon m^*},$$

N is the carrier concentration, and m* is the combined reduced mass for the electrons and holes given by $$m^* = \frac{m_e^* m_h^*}{m_e^* + m_h^*}$$

For a charge density level of $N = 10^{16} e/cm^3$ the plasma frequency is $w_p = 47THz$ which is well above any present electronic signals, yet far below the wavelength of infrared optical sources. Thus, by modulating the charge in an integrated circuit device, a small modulation occurs in the index of refraction. This index change can readily be detected by placing the device in one arm of a high resolution interferometer and then detecting the resulting amplitude modulation with a photodiode placed at the output of the interferometer. If the system is designed to be shot noise limited at the optical receiver, the minimum detectable sheet charge density will be given by $$\frac{\delta N_s}{\sqrt{Hz}} = \frac{4\pi^2 \epsilon m^*}{q^2 n_o \lambda_o} \sqrt{\frac{2q}{I_o}}$$

where $I_o$ is the average photocurrent in the photodiode, $n_o$ is the optical index of refraction, $\lambda_o$ is the vacuum wavelength of the optical probe beam, and $N_s$ is given by the integral of the charge density over the wafer thickness. For a photocurrent of $I_o = 1$ mA the minimum detectable sheet charge density will be $\delta N_s = 2.47 \times 10^8$ $e/cm^2/Hz$. If the capacitance/area of the device under test is known this sheet charge density can be expressed as a voltage modulation by the simple relation $$\delta V = \frac{q \delta N_s}{C'}$$

where c' is the capacitance/area. Applying this relationship to a simple reversed biased diode with a junction capacitance of $4.5 \times 10^{-8}$ F/cm² gives a minimum detectable signal of $\delta V = 880$ $\mu V/\sqrt{Hz}$ for 1 mA of photocurrent. For a forward biased diode with a minority carrier lifetime of $\tau = 500$ ns at a bias current density of $I_{dc} = 40$ mA/cm², $C' = 7.7 \times 10^{-7}/cm^2$ which gives a minimum detectable signal of $\delta V = 51$ $\mu V/\sqrt{Hz}$ for 1 mA of photocurrent. Hence this technique is capable of detecting microvolt signal fluctuations in active devices.

Figure 1:
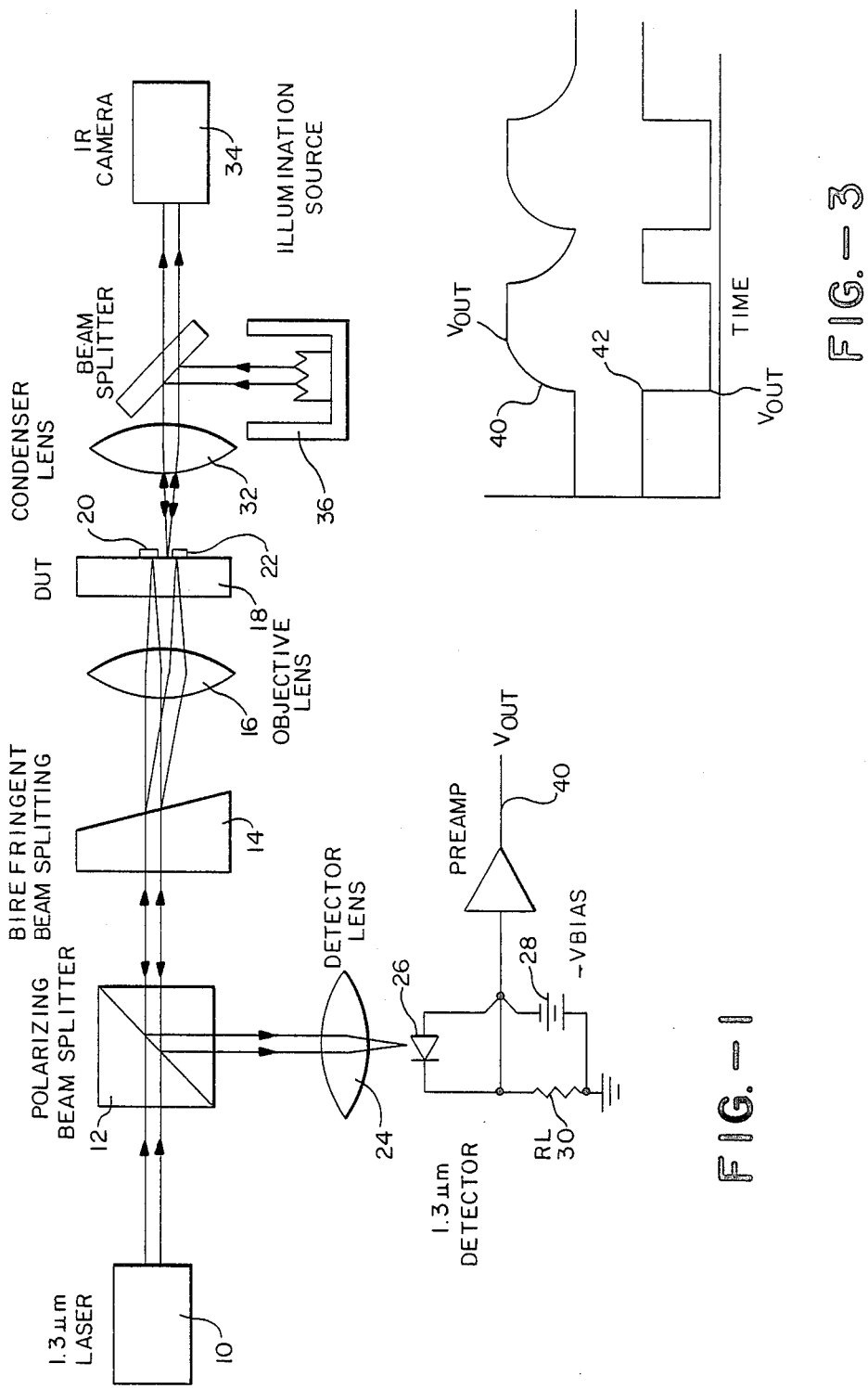
FIG. 1 is a functional block diagram of charge density determining apparatus in accordance with one embodiment of the invention.

Consider now FIG. 1 which is a functional block diagram of a measurement system used to detect charge induced phase fluctuations in accordance with one embodiment of the invention. A 1.3 μm continuous wave neodymium doped yttrium aluminum garnet (cw Nd:YAG) laser 10 is used because the absorption coefficient at this wavelength is a minimum and yet a spot size of about 2.5 μm can be achieved. The output from this laser is directed through a polarizing beam splitter cube 12 into a 1.5° calcite Nomarski wedge 14 whose crystal axes are placed at 45 degrees to the direction of polarization defined by the polarizing beam splitter cube. For maximum signal gain the Nomarski wedge is set to provide a round trip differential phase shift of an odd multiple of $\pi/2$ between the two orthogonal beam polarizations. Because of the birefringence of the wedge, two beams of orthogonal polarization are produced with an angle between them of 4.2 mrad. The objective lens 16 converts the slight angular separation produced by the wedge into a spatial separation at the device under test 18 (DUT). The two beams enter the backside of the wafer and pass through the sample to the front surface where one beam is reflected from metalization 20 over an active device and the other beam is reflected from metalization 22 over a reference point on the circuit. If the birefringent wedge 14 and the DUT 18 are at the front and back focal planes of the objective lens 16, the reflected beams from the DUT will return along the same optical path, and hence the Nomarski wedge will recombine the two beams into a single beam. The polarizing beam splitter 12 then mixes these two orthogonal polarizations and causes them to produce intensity modulated interference products that are focused by lens 24 on the Ge photodiode 26. The photodiode 26 is reverse biased by voltage source 28 which is serially connected through resistor 30 with photodiode 26. The condenser lens 32, IR camera 34, and illumination source 36 provide the means whereby the DUT can be visually aligned to the probe beam prior to the test sequence.

In one demonstration of charge detection in silicon, a large area (0.5 mm×0.5 mm) abrupt junction pn diode was used. The measured series resistance of the diode was 250 Ω. The zero bias junction capacitance/area of this device was measured to be $4.5 \times 10^{-8}$ F/cm² which gives a corresponding theoretical minimum detectable signal of 880 $\mu V/\sqrt{Hz}$ from 1 mA of photocurrent. This calculation agrees well with the observed minimum detectable signal of 930 $\mu V/\sqrt{Hz}$ at zero volts DC bias. In the forward biased condition, the injected charge storage significantly increases the capacitance/area and the minimum detectable signal is reduced to 51 $\mu V/\sqrt{Hz}$ for 1 mA of photocurrent.

Figure 2:
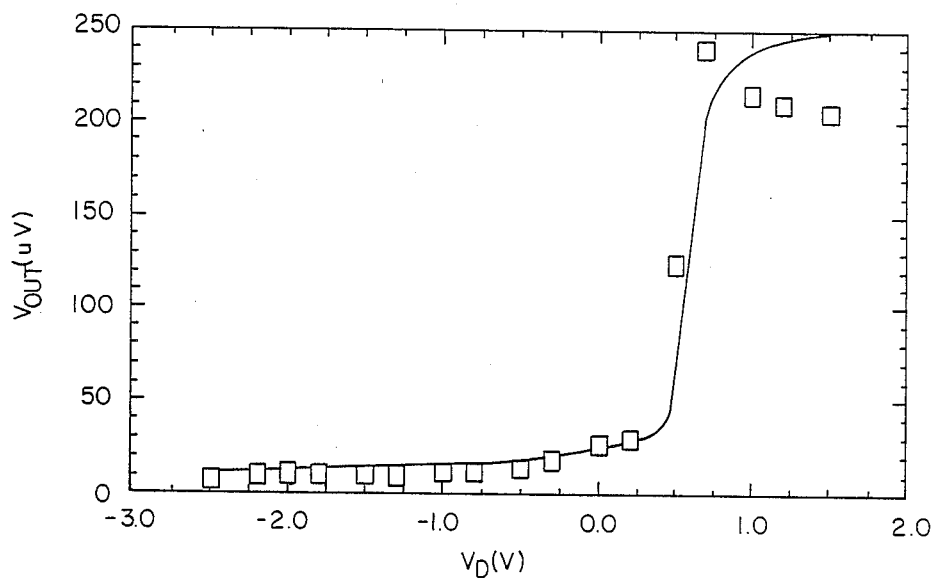
FIG. 2 is a comparison of the theoretical model and the experimentally measured detector voltage output versus diode dc voltage bias in the apparatus of FIG. 1.

FIG. 2 shows a plot of the small signal transfer function from the diode voltage to the optically received and amplified output signal (45 dB gain following a 50Ω photodiode load resistor) as a function of the DC bias applied to the diode. The data shows excellent agreement with theoretical values at reverse biases, and at forward biases below the signal gain saturation level. This saturation level occurs when the voltage applied across the diode series resistance is much larger than the small signal voltage across the diode. Beyond this DC bias, the experimental results are probably best explained by current crowding within the DUT. For reversed biased operation, the theory and data require no parameter fitting. For forward biased operation, the minority carrier lifetime, which was not measured, was adjusted to fit the data.

FIG. 3 shows a plot of the output 40 from the photodiode preamplifier when a ECL logic signal 42 was applied to the (0.5 mm×0.5 mm) diode device under test. The signal is bandwidth limited to 20 MHz. The rise and fall times shown are a direct result of diode series resistance and the active charge stored within the device from the minority carrier injection. Since the sensitivity scales directly with the bias current density and carrier lifetime, a typical bipolar junction transistor ($A_e = 25$ μm², $f_T = 1$ GHz), operating at bias currents greater than 30 μA, would produce a signal greater than that shown in FIG. 3. This suggests that multi-megabaud data could be captured with a high signal/noise ratio in real time. Charge detection of digital signals on an N-channel metal-oxide-silicon (NMOS) inverter have also been observed. However, since the capacitance/area in this device was governed by gate capacitance ($t_{ox}=1000\text{Å}$), the signals in this device were much smaller than for the forward biased diode and about the same size as for the reversed biased pn junction diode. With thinner gate oxides correspondingly larger signals will be observed.

In a modification of the apparatus of FIG. 1, the position of a single optical beam can be spatially modulated over a silicon wafer surface to detect stationary charge densities in one area relative to a reference area. The reference area may contain no charge density variation thereby giving an absolute reference value.

Figure 4:
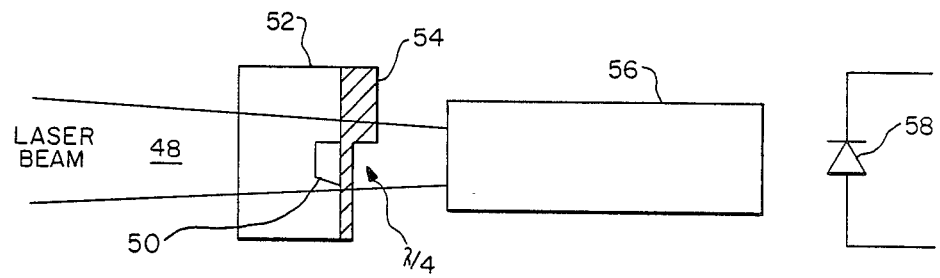
FIG. 4 is a functional block diagram of an alternative embodiment of the invention.

FIG. 4 is an alternative embodiment of the invention in which a coherent laser beam 48 is projected through the active region 50 in a silicon device 52. One surface of the device 52 has a silicon oxide layer 54, and the thickness of the layer is notched over the edge of the active region 50 as indicated. The notch is one-quarter wavelength of the frequency of the beam 48. The oxide functions as a phase shifter to the beam passing through the device. The phase shifted beam is then passed through a single mode optical fiber 56 to a photodiode 58. Phase modulation of the beam resulting from charge density modulation in the active device region is converted to amplitude modulation by the single mode fiber and then detected by the photodiode 58.

Figure 5:
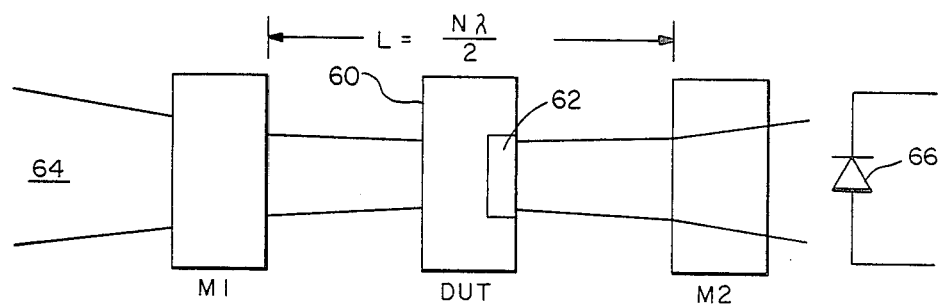
FIG. 5 is a functional block diagram of another embodiment of the invention.

FIG. 5 is yet another embodiment of the invention in which a device under test 60 having an active region 62 is placed between two Fabry-Perot etalons or mirrors, M1 and M2. The reflectivity of each mirror is less than one thereby allowing a portion of the beam to pass through. The spacing between the mirror surfaces is a multiple of one-half the wavelength of the coherent laser beam 64. Modulation of the charge density in the active region of the silicon device phase modulates the impinging beam which effectively varies the spacing of the two etalons and hence modulates the signal detected by the photo diode 66. The mirrors can be readily combined with the device under test by providing reflective dielectric coatings on opposing surfaces of the device under test.

As above described, the invention can be utilized to detect charge density in a semiconductor integrated circuit device, and the phase modulation of an optical beam can be utilized in an integrated optical waveguide. This can be achieved with the embodiment of FIG. 4 by integrating the waveguide 56 and photodiode 58 into the same substratre as the device under test 52.

FIG. 6 is a section view of a charge density modulated grating coupled interconnect including a P-type silicon substrate 70, an N-type epitaxial layer 73, and P+ doped regions 72 spaced in the surface of layer 71. A silicon oxide layer 73 covers the epitaxial layer 71, and steps are formed in the layer 71 above the P+ regions 72. Each step is λ/4 in height. An input optical beam 75 having a wavelength, λ, is diffracted by the grating whereby a zero order optically diffracted beam 76 is received by germanium detector 77, and first order optically diffracted beams 78 exit from either side of the grating. By placing charge on the regions 72 an amplitude modulated signal is transmitted to the detector 77.

FIGS. 7A and 7B are a top view and a section view of another electro-optic modulator in accordance with the invention. The device comprises a P-type substrate 80 having an intrinsic epitaxial layer 81 grown thereon, and an N-type epitaxial layer 82 grown on the layer 81. A vertical etch through layers 81 and 82 forms two optical paths 83 and 84 as shown in FIG. 7A which split and recombine a laser beam. P+ emitters 86 are formed in one optical path 84, and isolation regions 87 are formed in each path. In operation, an optical signal is passed through the intrinsic layer 81. The vertical mesa etch through the N and I regions provide lateral beam confinement, and vertical beam confinement in the I regions is provided by the static charge density difference between the N and I regions and between the P and I regions. By diffusing the P-type dopant (regions 86) into the N-type epitaxial layer a vertical PNP transistor can be formed. When the upper PN junction is forward biased holes are injected into the narrow N-type region between the P diffusion and the I layer. These holes diffuse across this region and are collected by a large reversed biased field across the NIP layers. This stored charge—i.e. carriers being swept across the high field region in the I layer—reduces the refractive index in that region. By splitting the initial optical beam into two portions at the left side of the chip and recombining the optical beams at the right side of the chip a conventional Mach-Zender interferometer is formed and the exiting optical signal is amplitude modulated. The drawing shows how two independent modulating devices could be fabricated on the same optical waveguide to increase the modulation depth or provide a simple technique for multiplexing signals together onto a common optical carrier. In addition since the optical waveguide region is remote from the upper N-type epitaxial region additional non-optical interacting integrated circuitry could be fabricated in this region. Hence this structure could provide an easily fabricated technique whereby optical signals can be modulated either for totally integrated optical devices or for use in fiber optic applications.

While the invention has been described with reference to specific embodiments, the descriptions are illustrative of the invention and not to be construed as limiting the invention. Various modifications and applications may occur to those skilled in the art without departing from the true spirit and scope of the invention as defined by the appended claims.

What is claimed is:

1. A method of determining charge density in a region of a silicon body comprising the steps of
    polarizing a laser beam,
    splitting the polarized beam into two orthogonally polarized beams,
    applying the two orthogonally polarized beams to the semiconductor body with one beam being directed to said region,
    recombining reflections of the two orthogonally polarized beams after passing through the semiconductor body, and
    detecting the recombined beam by photodiode means to obtain an intensity modulated signal indicative of differential charge density.

2. The method as defined by claim 1 wherein said step of splitting the polarized beam includes passing the polarized beam through the birefringent beam splitter.

3. The method as defined by claim 2 wherein said step of recombining reflections of the two orthogonally polarized beams includes passing the reflections of the two orthogonally polarized beams through said birefringent beam splitter.

4. A method of determining charge density in a region of a semiconductor body comprising the steps of
polarizing a laser beam,
spatially modulating said laser beam over the surface of a semiconductor body,
obtaining a reflection of said spatially modulated laser beam after passing through said semiconductor body, and
detecting differential relative phase of said reflected wave as indicative of charge density.

5. Apparatus for determining charge density in a region of a semiconductor body comprising
means for producing a laser beam,
polarizer means for receiving said laser beam,
birefringent beam splitter means for splitting said polarized beam into two orthogonally polarized beams,
lens means for applying the two orthogonally polarized beams to the semiconductor body with one beam being directed to said region,
means for directing reflections of the two orthogonally polarized beams after passing through the silicon body back to said birefringent beam splitter thereby combining the two beams, and
means for detecting the recombined beams to obtain an intensity modulated signal indicative of charge density.

6. An optical interconnect comprising
means for generating a laser beam having a fixed wavelength,
a semiconductor body having an active device region adjacent to a major surface and a dielectric layer on said major surface, said dielectric layer having a step in thickness over the active device region, said step being one-quarter of said fixed wavelength,
means for directing a laser beam through said step in said dielectric layer and said active device region,
a single mode optical fiber positioned to receive said beam after passing through said step in said dielectric layer and said semiconductor body and said active device region, and
a photodiode detector for receiving said laser beam as passed by said optical fiber.

7. A method of detecting charge density in an active device region in a semiconductor body comprising
generating a laser beam having a fixed wavelength,
providing first and second etalons in spaced alignment, said spacing being an integral multiple of one-half wavelength of said laser beam,
positioning said semiconductor body between said first and second etalons in axial alignment for axially receiving said laser beam, and providing a
detector means for receiving and detecting said laser beam as passed through one of said etalons.

* * * * *